United States Patent [19]

Harada

[11] Patent Number: 5,319,600
[45] Date of Patent: Jun. 7, 1994

[54] SEMICONDUCTOR MEMORY DEVICE WITH NOISE IMMUNITY

[75] Inventor: Teruhiro Harada, Tokyo, Japan

[73] Assignee: Oki Electric Industry Co., Ltd., Tokyo, Japan

[21] Appl. No.: 729,614

[22] Filed: Jul. 15, 1991

[30] Foreign Application Priority Data

Jul. 18, 1990 [JP] Japan .................................. 2-188103

[51] Int. Cl.$^5$ .............................................. G11C 7/02
[52] U.S. Cl. .................................... 365/206; 365/214
[58] Field of Search ............... 365/206, 207, 208, 226, 365/228, 214

[56] References Cited

U.S. PATENT DOCUMENTS

| | | | |
|---|---|---|---|
| 4,539,658 | 9/1985 | Shimohigashi et al. | 365/207 |
| 4,811,303 | 3/1989 | Hirai | 365/228 X |
| 4,943,949 | 7/1990 | Yanaguchi et al. | 365/206 |
| 5,160,861 | 11/1992 | Lee | 365/206 X |

Primary Examiner—Steven Mottola
Attorney, Agent, or Firm—Edward D. Manzo

[57] ABSTRACT

A semiconductor integrated circuit device chip mounts a group of voltage amplifier circuits and a group of output transistors on the surface thereof. The group of voltage amplifier circuits are arranged at an area remote from the group of output transistors on the chip to prevent the voltage amplifiers from operating erroneously due to a potential variation caused by a switching operation of the output transistors.

19 Claims, 1 Drawing Sheet

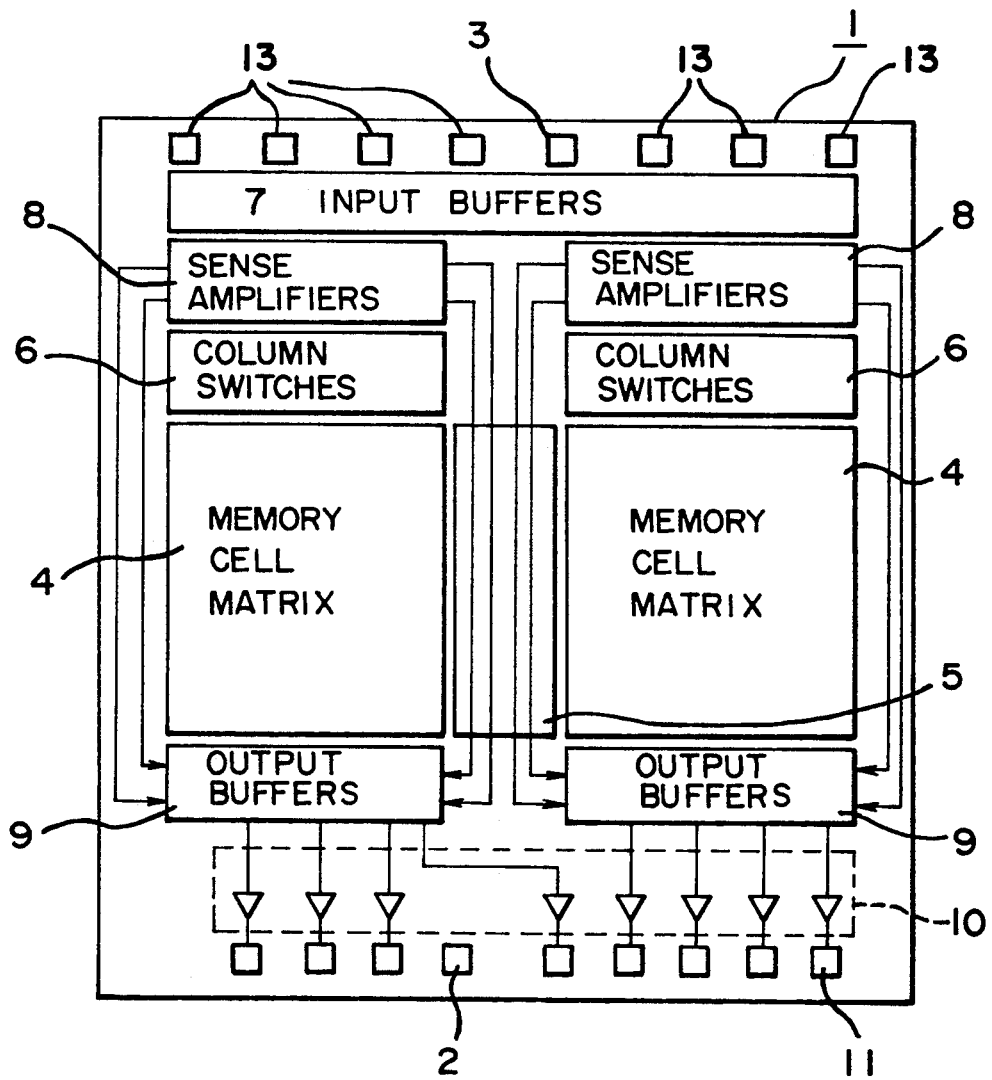

SEMICONDUCTOR MEMORY DEVICE WITH NOISE IMMUNITY

REFERENCE TO RELATED APPLICATIONS

This invention claims the right of priority under 35 U.S.C. 119, of Japanese Patent Application Serial No. 02-188103 filed on Jul. 8, 1990.

BACKGROUND OF THE INVENTION

1. Field of the Invention

The present invention relates to a semiconductor integrated circuit device, and in particular to a semiconductor integrated circuit chip having large load driving output circuits and small voltage amplifying circuits.

2Description of the Related Art

A semiconductor read-only memory (ROM) is a memory device in which information is stored permanently. The ROM device includes a plurality of memory cells in a memory cell array. For example, such a conventional memory device is disclosed in the paper entitled, "5V-only 256 kbit CMOS Flash EEPROM", 1989 IEE, ISSCC89, SESSION: THAM 10.3, pp. 132–133.

In such a case that data previously stored in a memory cell in a memory cell array is read out, the corresponding memory cell is specified by a selected word line and a selected bit line. Since the selected memory cell has a gate connected to a read line and a drain connected to a bit line, a current is delivered to a sense amplifier in accordance with the previously stored data. The current is converted into a voltage and amplified by the sense amplifier, and it is then transmitted to an output buffer. The data is transmitted to an output transistor from the output buffer and is then outputted from an output pad. Data stored in a semiconductor memory device are read out, the data to outputted from the output pads through the above-mentioned operation. Accordingly, sense amplifiers and output transistors are arranged at the same side on a conventional semiconductor device chip.

However, with the circuit block arrangement of the above-mentioned conventional device, since both the sense amplifiers and the output transistors are arranged in group on the same side of a chip, the impedance of ground wiring including a substrate between circuit blocks is low.

It has been known that the potential of the ground wiring fluctuates owing to a discharge current from the load upon switching of the output transistors for driving a large load. In general, dummy memory cells are used as means for realizing high-speed and wide margin for ROMs. However, in this arrangement, since a parasitic capacitive unbalance exists between sense lines (or data bus) which is the input of the sense amplifiers and the dummy lines, data may be inverted if the voltage fluctuation at the ground wiring is large. In the conventional devices, since the impedance between the sense amplifier and the output transistor is low, a small voltage amplifying circuit such as the sense amplifier is affected erroneously by noise caused by the switching of the output transistor.

BRIEF SUMMARY OF THE INVENTION

The present invention is devised in view of the above-mentioned problems inherent to the prior art.

Accordingly, one object of the present invention is to provide a semiconductor integrated circuit device which has good noise immunity characteristics and wide signal margin.

Accordingly, another object of the present invention is to provide a semiconductor integrated circuit device in which a voltage amplifier circuit is arranged on an area remote from an area on which output transistors are concentrated, for example, on the input side in opposite to the output transistors within a chip, whereby it is possible to eliminate the problem in which the voltage amplifier circuit is likely to be affected by swing a substrate potential (GND) during a switching operation of the output transistors.

To the end, according to the present invention, a semiconductor integrated circuit device comprises a semiconductor chip incorporating therein a amplifier circuit for amplifying a potential amplitude below a source voltage, and a load driving output circuit, wherein the amplifier circuit is separated from the output circuit as far as possible within the semiconductor chip.

Since an amplifier circuit is separated from an output circuit composed of output transistors to the extent they have no influence on each other, it is possible to substantially eliminate the effects of noise which occurs upon switching of the output transistors.

The further scope and applicability of the present invention will become apparent from the detailed description and specific example, while indicated preferred embodiments of the invention are given by way of illustration only, since various changes and modifications within the spirit and scope of the invention will become apparent to those skilled in the art from this detailed description.

BRIEF DESCRIPTION OF THE DRAWING

These and other features and advantages of the invention may be more completely understood from the following detailed description of the preferred embodiments of the invention with reference to the accompanying drawings in which:

the sole figure is a block diagram illustrating a circuit block layout of a semiconductor memory integrated circuit according to the present invention.

DESCRIPTION OF THE PREFERRED EMBODIMENTS

An embodiment of a semiconductor integrated circuit device according to the present invention will be detailed hereinbelow with reference to the accompanying drawing.

Sole figure is a block diagram illustrating a circuit block layout of a semiconductor integrated circuit device according to the invention. A ROM IC chip 1 is made of a semiconductor material such as silicon. The IC chip 1 mounts a group of output buffers 9 (or circuits) each for driving a relatively large load, and a group of sense amplifiers 8 each for amplifying a lower potential than a power source voltage. Referring to this figure, a bonding pad 2 is coupled to a ground potential (GRD). A bonding pad 3 is coupled to a power source potential. Each memory cell matrix (or arrays) 4 is composed of several memory cells which are arranged in a matrix pattern in X- and Y-axial directions. One bit of information is stored in each of the memory cells. A decoder 5 decodes lead lines which extend in the X-axial direction and each of which serves as a gate electrode for the memory cells arranged in the memory array 4. Each of column switchers 6 decodes bit lines which extend in the Y-axial direction and each of which serves as a drain electrode for the memory cells. All bonding pads 13 are arranged at the top side of the chip 1. These pads act as input pads, excepting the power source pad 3. Accordingly, input buffers 7 are arranged on the topmost part of the chip 1. Further, a group of sense amplifiers 8 are arranged below the input buffers 7, and a group of output buffers 9 and a group of output transistors 10 are arranged in the lowermost part of the chip 1. The group of output transistors 10 are remote from the sense amplifiers 8. Output pads 11 are arranged on the bottommost part of the chip 1.

Thus, in this arrangement, the sense amplifiers 8 are separated far away from the output transistors 11 to prevent erroneous operation due to spike noise generated by the switching operation of the output transistors 10.

Next, an operation will be explained hereinbelow on an embodiment of the present invention with reference to the Figure.

One group of address input signals inputted from the outside are amplified up to a source voltage/ground potential level by the sense amplifiers 8 and are then delivered to the row decoders 5. The row decoders 5 decode the signal to select one of the word lines. Further, the other address input signal is amplified by the other sense amplifier and is delivered to the column switches 6 so as to electrically connect at least one of the bit lines to the sense amplifier 8. Although not shown in the figure, a memory cell having the selected bit and word lines which are connected respectively to a drain and a gate electrode, allows a current, corresponding to a previously stored datum to flow. The sense amplifier 8 converts the current value into a voltage value and then amplifies and delivers the latter. The data delivered from the sense amplifier 8 is transmitted to the output transistor 10 and then to the output pad 11.

With the arrangement of the circuit blocks in this embodiment, since the output transistors 10 as a noise source are far distant from the sense amplifiers 8 for amplifying a feeble voltage, spike noise generated by the switching of the output transistors 10 attenuates before being transmitted to the sense amplifiers 8, due to the impedance of the power source wiring and the substrate therebetween. That is, it is prevented that the sense amplifiers are affected by noise which occurs when the output transistors 10 perform their switching operation.

Further, an input buffer for amplifying a TTL level input is one example of circuits for amplifying a voltage lower than a power source voltage, such as the sense amplifier 8. In this input buffer, it is not rare that the input voltage level is an absolute level irrespective of the GND level which is a reference voltage in the chip. Accordingly, the fluctuation of the reference voltage in the chip directly affects the determination of the input voltage level.

Thus, it is necessary to locate a circuit for amplifying a potential amplitude which is under a source voltage, far distant from a means for driving a large load, such as the output transistors 10 by a some degree.

In the above-mentioned arrangement according to the present invention, since a circuit for amplifying a potential amplitude below a power source voltage, such as a sense amplifier, is located far distant from a means for driving a large load, such as output transistors, a highly reliable semiconductor integrated circuit in which no inversion of data results and which is not subjected to noise generated upon switching of the output transistors 10, can be materialized.

Although one embodiment of the present invention has been explained hereinabove, in which the present invention is applied for a ROM, the present invention should not be limited particularly to this ROM, but it can be applied to various kinds of semiconductor integrated circuit devices including a small signal amplifying circuit which tends to be affected by noise generated upon switching of a large load driving output circuit.

What we claimed is:

1. A semiconductor memory device layout comprising:
   a semiconductor chip having a first region, a second region and a third region on a main surface thereof, said second region being located between said first region and said third region to separate dimensionally said first region from said third region;
   a memory cell array located in said second region for storing data;
   a sense amplifier circuit located in said first region, for amplifying a small signal; and
   an output circuit located in said third region for outputting a signal, wherein said output circuit includes a plurality of output transistors and a plurality of output buffers coupled to said output transistors.

2. A semiconductor memory device layout comprising:
   a semiconductor chip having a first side and a second side opposite to the first side;
   a sense amplifier located in the vicinity of the first side on the semiconductor chip, for amplifying a potential level;
   an output circuit located in the vicinity of the second side on the semiconductor chip, for outputting a signal, wherein said output circuit includes a plurality of output transistors and a plurality of output buffers coupled to said output transistors; and
   a memory cell array located between the sense amplifier and the output circuit, for storing data.

3. A semiconductor memory device layout comprising:
   a memory cell array having a first side and a second side opposite to the first side, for storing data;
   a sense amplifier located in the vicinity of the first side, for amplifying a potential level; and
   an output circuit located in the vicinity of the second side, for outputting a signal, and output circuit including a plurality of output transistors and a plurality of output buffers coupled to said output transistors.

4. A semiconductor memory device layout comprising:
   a semiconductor chip having a first side and a second side opposite to the first side;
   a sense amplifier located in the vicinity of the first side on the semiconductor chip, for amplifying a potential level;
   an output circuit located in the vicinity of the second side on the semiconductor chip, for outputting a signal;
   a memory cell array located between the sense amplifier and the output circuit, for storing data; and
   a plurality input pads, substantially all of which are located in the vicinity of said first side.

5. A semiconductor memory device layout comprising:
- a memory cell array having a first side and a second side opposite to the first side, for storing data;
- a sense amplifier located in the vicinity of the first side, for amplifying a potential level;
- an output circuit located in the vicinity of the second side, for outputting a signal; and
- a plurality of input pads, substantially all of which re located in the vicinity of said first side.

6. The memory device layout of claim 2 wherein said memory device comprises a read only memory.

7. The memory device layout of claim 3 wherein said memory device comprises a read only memory.

8. The memory device of claim 5 wherein the memory device is a read only memory.

9. The memory device of claim 8 wherein the memory device is a read only memory.

10. The memory device of claim 2 wherein the memory device also includes;
- a plurality of input pads, substantially all of which are located along said first side;
- a plurality of input buffers located between said memory cell array and substantially all of said input pads; and
- a plurality of output pads located along said second side.

11. The memory device of claim 3 wherein the chip also includes;
- a plurality of input pads, substantially all of which are located along said first side;
- a plurality of input buffers located between said memory cell array and substantially all of said input pads; and
- a plurality of output pads located along said second side.

12. A semiconductor memory device layout comprising:
- a semiconductor chip having a first region, a second region and a third region on a main surface thereof, said second region being located between said first region and said third region to separate dimensionally said first region from said third region;
- a memory cell array located in said second region for storing data;
- a sense amplifier circuit located in said first region, for amplifying a small signal;
- an output circuit located in said third region for outputting a signal; and
- a plurality of input pads, substantially all of which are located in the vicinity of said first side.

13. The layout of claim 1 wherein the chip also includes a plurality of input pads, substantially all of which are located in the vicinity of a first side of said first region.

14. The layout of claim 13 further including a plurality of input buffers located between said input pads and said sense amplifier circuit.

15. The layout of claim 2 wherein the chip also includes a plurality of input pads, substantially all of which are located in the vicinity of said first side.

16. The layout of claim 15 further including a plurality of input buffers located between said input pads and said sense amplifier.

17. The layout of claim 3 wherein the chip also includes a plurality of input pads, substantially all of which are located in the vicinity of said first side.

18. The layout of claim 17 further including a plurality of input buffers located between said input pads and said sense amplifier.

19. The memory device layout of claim 1 wherein said memory device comprises a read only memory.

* * * * *